US00RE38956E

(19) United States
(12) Reissued Patent
Beffa et al.

(10) Patent Number: US RE38,956 E
(45) Date of Reissued Patent: Jan. 31, 2006

(54) DATA COMPRESSION CIRCUIT AND METHOD FOR TESTING MEMORY DEVICES

(75) Inventors: Ray Beffa, Star, ID (US); Leland R. Nevill, Boise, ID (US); Neil L. Hansen, Boise, ID (US); Eugene H. Cloud, Venice, FL (US)

(73) Assignee: Micron Technology, Inc., Boise, ID (US)

(21) Appl. No.: 10/139,131

(22) Filed: May 2, 2002

Related U.S. Patent Documents

Reissue of:
(64) Patent No.: 6,058,056
Issued: May 2, 2000
Appl. No.: 09/070,558
Filed: Apr. 30, 1998

(51) Int. Cl.
*G11C 29/00* (2006.01)

(52) U.S. Cl. ..... 365/201; 365/200; 365/189.07; 714/718

(58) Field of Classification Search ..... 365/201, 365/200, 189.07; 714/718
See application file for complete search history.

(56) References Cited

U.S. PATENT DOCUMENTS 5,148,398 A * 9/1992 Kohno ..... 365/201
5,231,605 A * 7/1993 Lee
5,568,437 A * 10/1996 Jamal
5,859,804 A * 1/1999 Hedberg et al.
5,913,928 A * 6/1999 Mazano
5,936,901 A * 8/1999 Wong et al. ..... 365/201
6,202,179 B1 * 3/2001 Morzano ..... 365/201

* cited by examiner

*Primary Examiner*—Huan Hoang
(74) *Attorney, Agent, or Firm*—Dorsey & Whitney LLP

(57) ABSTRACT

A test circuit detects defective memory cells in a memory device. The test circuit includes a test mode terminal adapted to receive a test mode signal. An error detection circuit includes a plurality of inputs and an output, each input coupled to some of the plurality of memory cells. The error detection circuit develops an active error signal on an output when the binary value of data on at least one input is different from predetermined binary values of data. A control circuit is coupled to the test mode terminal, the error detection circuit, and the memory cells. The control circuit is operable responsive to the test mode signal being active to apply the data of accessed memory cells to the associated inputs of the error detection circuit such that the error detection circuit drives the error signal active when the binary value of the data stored in at least one accessed memory cell is different from predetermined binary values.

29 Claims, 3 Drawing Sheets

DATA COMPRESSION CIRCUIT AND METHOD FOR TESTING MEMORY DEVICES

Matter enclosed in heavy brackets [ ] appears in the original patent but forms no part of this reissue specification; matter printed in italics indicates the additions made by reissue.

TECHNICAL FIELD

The present invention relates generally to the testing of semiconductor memories, and more specifically to a method and circuit for performing on-chip data compression to reduce the time for testing memory cells in a semiconductor memory.

BACKGROUND OF THE INVENTION

During the manufacture of semiconductor memories, such as a synchronous dynamic random access memories ("SDRAMs"), it is necessary to test each memory to ensure it is operating properly. Electronic and computer systems containing semiconductor memories also normally test the memories when power is initially applied to the system. A typical SDRAM includes a number of arrays, each array including a number of memory cells arranged in rows and columns. During testing of the SDRAM, each memory cell must be tested to ensure it is operating properly. In a typical prior art test method, data having a first binary value (e.g., a "1") is written and read from all memory cells in the arrays, and thereafter data having a second binary value (e.g., a "0") is typically written to and read from the memory cells. A memory cell is determined to be defective when the data written to the memory cell does not equal that read from the memory cell. As understood by one skilled in the art, other test data patterns may be utilized in testing the memory cells, such as an alternating bit pattern 101010 . . . written to the memory cells in each row of the arrays.

In a typical test configuration, an automated memory tester is coupled to address, data, and control buses of the SDRAM, and develops signals on these buses to perform the desired tests. The tester applies data transfer commands on the control bus, addresses on the address bus, and either provides or receives data on the data bus depending on whether the data transfer command is a read or write. In addition, the tester develops a clock signal which drives circuitry in the SDRAM to synchronously perform each of the steps involved in a particular data transfer operation, as understood by one skilled in the art. The signals developed by the tester must satisfy particular timing parameters of the SDRAM that are established relative to particular edges of the clock signal.

In modern SDRAMs, the tester may need to develop a clock signal having a frequency of 100 megahertz or greater, and must also develop the associated address, data, and control signals at increasingly faster rates due to the shorter interval between rising edges of the clock signal. As the frequency of operation increases, the design and layout of circuitry associated with a particular application typically become more complex and, as a result, typically more expensive. This is due in part to the potential for coupling electromagnetic energy at high frequencies between circuit lines, the critical nature of the physical line lengths at high frequencies, and the potential for small delays to result in inoperability of the circuit. The tester could supply a lower frequency clock signal to the SDRAM, but this would increase the time and thus the cost of testing the SDRAM.

Also, the test would then not be performed at the more stringent high speeds at which the SDRAM may operate during use. Thus, the tester must supply very high frequency clock signals to modem SDRAMs. Testers capable of operating at these higher frequencies are typically more expensive than lower frequency testers. In fact, the cost of such testers typically increases exponentially with increases in the frequency of operation. For example, a tester operating at 50 megahertz may cost approximately $1 million while a tester operating at 100 megahertz can cost up to $5 million.

In addition to the frequency of operation of the tester, the number of data transfer operations the tester must perform in writing data to and reading data from the memory cells affects the time and thus the cost of testing the SDRAM. As the storage capacity of SDRAM increases, the number of data transfers performed in testing every memory cell increases accordingly. For example, in a memory array having n rows and m columns of memory cells, the tester performs n×m cell accesses in writing the first binary data values to all the memory cells in the array, and thereafter performs n×m cell accesses in reading the same data. The tester must once again perform n×m access in writing data having a second binary value to each memory cell, and the same number of accesses in reading this data. The tester thus performs a total of four times n×m cell accessories, each of which requires a bus cycle to perform, in testing each memory cell in the array. In the case of a 16 megabit×4 DRAM, 67,108,864 bus cycles are required to perform a complete test of every memory cell.

There is a need for a test circuit that reduces the time it takes a low frequency memory tester to test the memory cells in a high frequency SDRAM.

SUMMARY OF THE INVENTION

A test circuit detects defective memory cells in a plurality of memory cells in a memory device. The test circuit includes a test mode terminal adapted to receive a test mode signal. An error detection circuit includes a plurality of inputs and an output, each input coupled to some of the plurality of memory cells. The error detection circuit develops an active error signal on an output when the binary value of data on at least one input is different from predetermined binary values of data. A control circuit is coupled to the test mode terminal, the error detection circuit, and the memory cells. The control circuit is operable responsive to the test mode signal being active to apply the data of accessed memory cells to the associated inputs of the error detection circuit such that the error detection circuit drives the error signal active when the binary value of the data stored in at least one accessed memory cell is different from predetermined binary values.

DETAILED DESCRIPTION OF THE INVENTION

Figure 1:
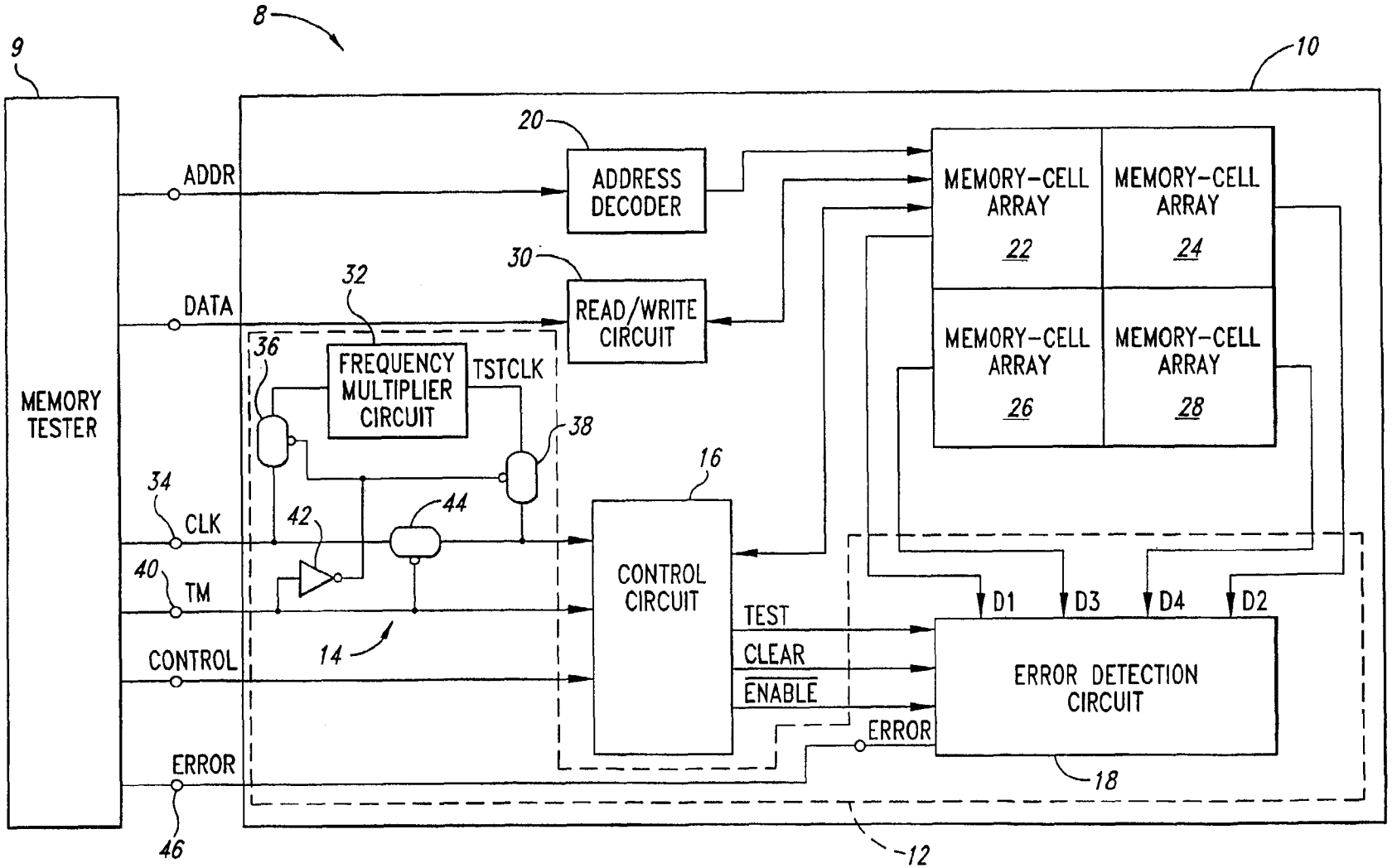
FIG. 1 is a functional block diagram of a test system including a memory device having a test circuit according to one embodiment of the present invention.

FIG. 1 is a functional block diagram of a test system 8 comprising a memory tester 9 coupled to a memory device 10 including a test circuit 12 according to one embodiment of the present invention. The memory tester 9 places the memory device 10 in a test mode during which the test circuit 12 detects the defective memory cells in the memory device 10 and provides a signal to the tester 9 indicating the presence of any such detected defective cells as will be explained in more detail below.

The memory device 10 includes an address decoder 20 receiving address signals on an address bus ADDR. The address decoder 20 decodes the address signals and outputs a decoded address to a number of memory-cell arrays 22–28. The memory-cell arrays 22–28 each include a number of memory cells (not shown in FIG. 1) arranged in rows and columns, each memory cell operable to store a bit of data as known in the art. A read/write circuit 30 is coupled between a data bus DATA and the arrays 22–28, and transfers data to and from the data bus DATA during read and write data transfer operations, respectively. A control circuit 16 controls the address decoder 20, arrays 22–28, and read/write circuit 30 responsive to a clock signal CLK received on a terminal 34. Although the address decoder 20, read/write circuit 30, and control circuit 16 are shown coupled only to the array 22, one skilled in the art will realize that these circuits are coupled to all of the arrays 22–28 to perform their desired functions.

The test circuit 12 includes a conventional frequency multiplier circuit 32 receiving the clock signal CLK through a transfer gate 36. In response to the clock signal CLK, the frequency multiplier circuit 32 develops a test clock signal TSTCLK having a frequency greater than the frequency of the clock signal CLK. The test clock signal TSTCLK is applied through a transfer gate 38 to the control circuit 16. The clock circuit 14 further includes a transfer gate 44 coupled between the clock terminal 34 and the control circuit 16 and receiving the test mode signal TM on its control input.

The test circuit 12 further includes an error detection circuit 18 receiving data signals D1–D4 from the arrays 22–28, respectively, and receiving control signals TEST, CLEAR, and $\overline{\text{ENABLE}}$ from the control circuit 16. In response to these control signals the error detection circuit 18 compares the binary values of the data signals D1–D4, and develops an error signal ERROR on a terminal 46 indicating the result of this comparison, as will be explained in more detail below. The error detection circuit 18 can compare the binary values of the data signals D1–D4 to each other or to predetermined binary values, as understood by one skilled in the art.

Figure 2:
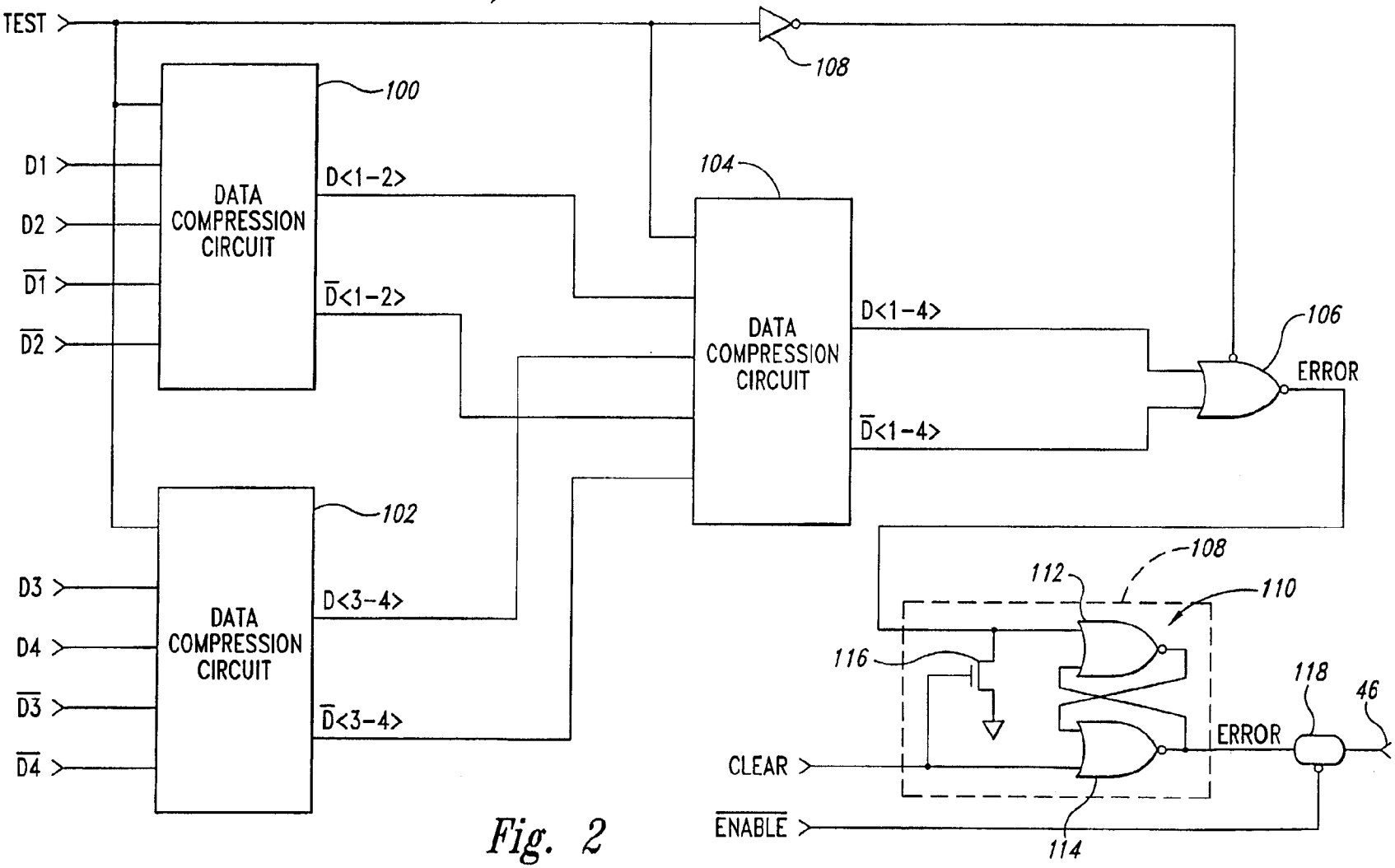
FIG. 2 is a functional block diagram of one embodiment of the error detection circuit of FIG. 1.
Figure 3:
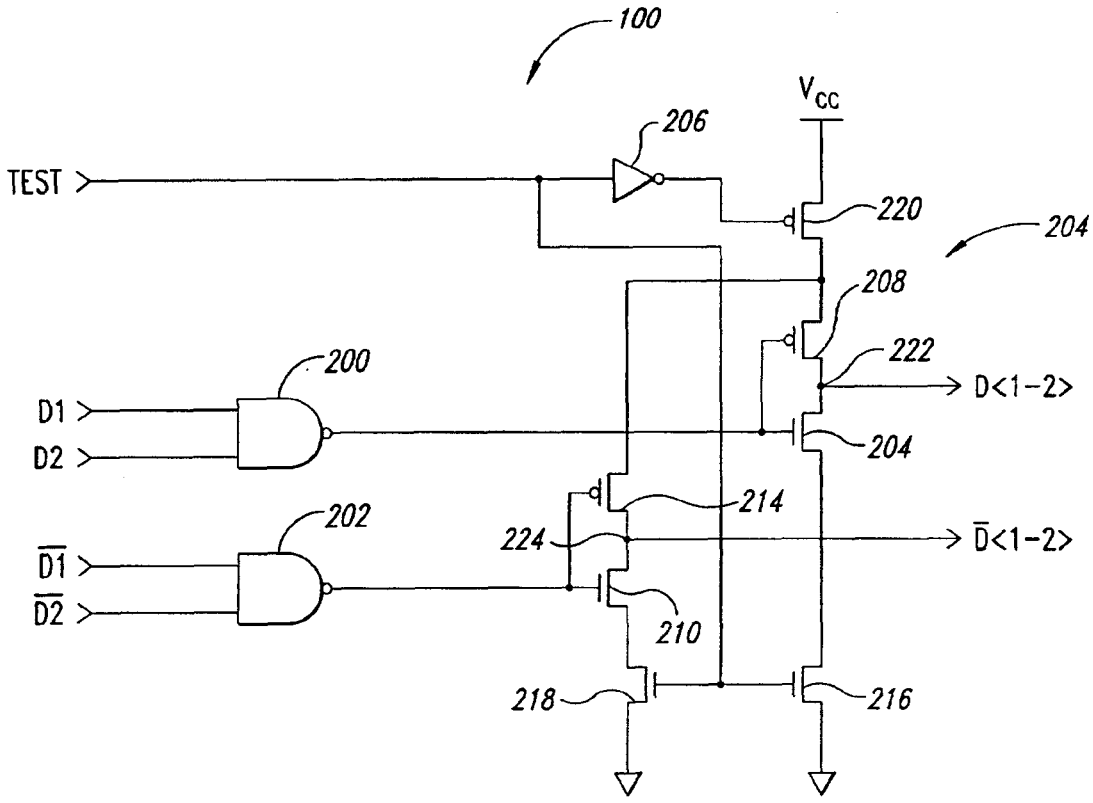
FIG. 3 is a schematic of one embodiment of the data compression circuits of FIG. 2.

FIG. 2 is a more detailed schematic block diagram of one embodiment of the error detection circuit 18 of FIG. 1. The error detection circuit 18 includes three data compression circuits 100–104 that collectively compress the data signals D1–D4 received from the arrays 22–28, as will be explained in more detail below. The data signals D1–D4 each include a complementary signal portion designated by the overbar in FIG. 2, with these complementary portions being omitted in FIG. 1 for the sake of brevity. A detailed schematic of one embodiment of the data compression circuit 100 is shown in FIG. 3. The data compression circuits 102 and 104 are identical to the data compression circuit 100 and thus, for the sake of brevity, only the circuit 100 will be described in more detail with reference to FIG. 3. The data compression circuit 100 includes a NAND gate 200 receiving the data signals D1 and D2 on its inputs, and a NAND gate 202 receiving the data signals $\overline{D1}$ and $\overline{D2}$ on its inputs. The output of the NAND gate 200 is applied to a gate of an NMOS drive transistor 204 and to a gate of a PMOS drive transistor 208. In response to the output of the NAND gate 200, the transistors 204 and 208 operate in a complementary manner to develop an output signal D[1-2] on a node 222. A first enable transistor 220 couples the source of the transistor 208 to a supply voltage source $V_{CC}$ in response to the test signal TEST applied to its gate through an inverter 206. A second enable transistor 216 couples the source of the transistor 204 to ground in response to the test signal TEST. The output of the NAND gate 202 is similarly coupled to a gate of an NMOS drive transistor 210 and to a gate of a PMOS drive transistor 214. In response to the output of the NAND gate 202, the transistor 210 and 214 operate in a complementary manner to develop an output signal $\overline{D}$[1-2] on an output node 224. The source of the transistor 210 is coupled through a third enable transistor 218 to ground in response to the test signal TEST, and the source of the transistor 214 coupled to the supply voltage source $V_{CC}$ through the enable transistor 220.

In operation, the data compression circuit 100 operates in an active 20 mode and an inactive mode in response to the test signal TEST. When the test signal TEST is inactive low, the enable transistors 216, 218 and 220 turn OFF isolating the drive transistors 204, 208, 210, and 214 from the supply voltage $V_{CC}$ and the ground. In this mode, high impedances are presented, respectively, on the output nodes 222 and 224 independent of the outputs of the NAND gates 200 and 202. When the test signal TEST is active high, the enable transistors 216 and 218 turn ON coupling the sources of the output transistors 204 and 210, respectively, to ground, and the enable transistor 220 turns ON coupling the sources of the output transistors 208 and 214 to the supply voltage source $V_{CC}$. In the active mode, the state of the output signals D[1-2] and $\overline{D}$[1-2] is determined by the binary values of the data signals D1, $\overline{D1}$ and D2, $\overline{D2}$. For example, assume the data signals D1 and D2 are both high. In response to the high data signals D1 and D2, the NAND gate 200 drives its output low turning OFF the transistor 204 and turning ON the transistor 208 which drives the voltage on the output node 222 high to approximately the supply voltage $V_{CC}$ through the transistors 208 and 220. When the data signals D1 and D2 are high, the data signals $\overline{D1}$ and $\overline{D2}$ are accordingly low. In response to the low data signals $\overline{D1}$ and $\overline{D2}$, the NAND gate 202 drives its output high, turning OFF the transistor 214 and turning ON the transistor 210 thereby driving the voltage on the output node 224 low to approximately ground through the transistors 210 and 218. Thus, when the data signals D1 and D2 are both high, the data compression circuit 100 drives the output signals D[1-2] and $\overline{D}$[1-2] high and low, respectively.

The data compression circuit 100 operates in a complementary manner when the data signals D1 and D2 are low. More specifically, when the data signals D2 and D2 are low, the NAND gate 200 drives its output high turning the transistors 204 and 208 ON and OFF, respectively, and thereby driving the output signal D[1-2] low through the transistors 204 and 216. The data signals $\overline{D1}$ and $\overline{D2}$ are high when the signals D1 and D2 are low causing the NAND gate 202 to drive its output low. The low output from the NAND gate 202 turns the transistors 210 and 214 OFF and ON, respectively, which, in turn, drives the output signal D[1-2] high through the transistors 214 and 220. If the data signals D1 and D2 have different binary values, both the NAND gates 220 and 202 drive their outputs high. In response to the high output from the NAND gate 200, the output signal D[1-2] is driven low through the transistors 204 and 216. In the same way, the high output from the NAND gate 202 drives the output signal $\overline{D}$[1-2] low through the transistors 210 and 218.

The data compression circuit 100 compresses the complementary data signals D1, $\overline{D1}$ and D2, $\overline{D2}$ to the single pair of output signals D[1-2], $\overline{D}$[1-2]. When the data signals D1 and D2 are high, the output signals D[1-2] and $\overline{D}$[1-2] are high and low, respectively, and when the data signals D1 and D2 are low the output signals D[1-2] and D [1-2] are low and high, respectively. The data compression circuit 100 detects when the data signals D1 and D2 are unequal and drives the output signals D[1-2] and $\overline{D}$[1-2] are low. It should be noted, however, that the data compression circuit 100 is limited to detecting the failure of a single memory cell. This is true because the failure of multiple memory cells could go undetected by the circuit 100. For example, assume the two memory cells storing data corresponding to the data signals D1 and D2 both fail in a way that they always store a binary 1 regardless of the data written to the cell. In this situation, the data compression circuit 100 will not detect an error because the data signals D1 and D2, although erroneous, are equal.

Returning now to FIG. 2, the data compression circuit 102 receives the data signals D3, $\overline{D3}$ and D4, $\overline{D4}$ and the test signal TEST, and develops output signals D[3-4] and $\overline{D}$[3-4]. The data compression circuit 104 receives the output signals D[1-2], D[1-2] from the data compression circuit 100 and the output signals D[3-4] and $\overline{D}$[3-4] from the data compression circuit 102 and develops output signals D[1-4] and $\overline{D}$[1-4]. The output signals D[1-4] and $\overline{D}$[1-4] are applied to the inputs of a NOR gate 106 which drives its output high when both the signals D[1-4] and $\overline{D}$[1-4] are low. The test signal TEST is applied through an inverter 108 to an enable input of the NOR gate 106. When the test signal TEST is high, the NOR gate 106 is enabled and operates as a conventional NOR gate, and when the test signal TEST is inactive low the NOR gate 106 is disabled placing its output in a high impedance state. The output of the NR gate 106 is coupled to an input of an error latch 108 that latches an error signal ERROR active high in response to the output of the NOR gate 106 going high. More specifically, the output of the NOR gate 106 is applied to a set input of an RS flip-flop 110 including a pair of cross-coupled NOR gates 112 and 114. A clear signal CLEAR is applied to a reset input of the RS flip-flop 110 and is further applied to a gate of an NMOS transistor 116 coupled between the set input of the RS flip-flop 110 and ground. The RS flip-flop 110 develops the error signal ERROR on the output of the NOR gate 114. In operation, when the clear signal CLEAR is inactive low and the output of the NOR gate 106 goes high, the RS flip-flop 110 latches the error signal ERROR active high. The RS flip-flop 110 maintains the error signal ERROR active high until the clear signal CLEAR goes active high. When the clear signal CLEAR goes high, the transistor 116 turns ON driving the set input low and reset input high and the RS flip-flop 110 latches the error signal ERROR inactive low. The error signal ERROR is applied through a transfer gate 118 to the terminal 46 of the memory device 10. The transfer gate 118 receives the enable signal $\overline{ENABLE}$ from the control circuit 76 (FIG. 1) on its control input and applies the error signal ERROR on the terminal 46 when the enable signal $\overline{ENABLE}$ is active low.

Returning now to FIG. 1, the overall operation of the test system 8 and operation of the memory device 10 outside of the test system 9 will now be described in more detail. The memory device 10 operates in two mode, a normal mode and a test mode. The memory device 10 operates in the normal mode outside of the test system 9. In the normal mode of operation, an external circuit (not shown in FIG. 1), such as a microprocessor, drives the test mode signal TM inactive low and applies address, data, and control signals on the respective buses of the memory device 10, and applies the clock signal CLK on the clock terminal 34. When the test mode signal TM is inactive low, the transfer gates 36 and 38 turn OFF and the signal CLK is transferred through the activated transfer gate 44 to the control circuit 16. In response to the signal CLK, the control circuit 16 controls the address decoder 20, arrays 22–28, and read/write circuit 30 to perform data transfer operations. During data transfer operations, the external circuit places address, data, and control signals on the response buses to form a command, such as an ACTIVE, READ, or WRITE command, as understood by one skilled in the art. The commands is latched by the memory device 10 in response to a rising edge of the clock signal CLK. In response to a READ command, the address decoder 20 decodes the latched memory address and accesses the addressed memory cells in the arrays 22–28. The data stored in the accessed memory cells in the arrays 22–28 is transferred through the read/write circuit 30 and onto the data bus DATA where it is available to be read by the external circuit. In response to a WRITE command, the address decoder 20 once again decodes the latched address and accesses the addressed memory cells in the arrays 22–28. The read/write circuit 30 then transfers the data placed on the data bus DATA to the addressed memory cells in the arrays 22–28 where it is stored.

The memory device 10 operates in the test mode when in the test system 8 as shown in FIG. 1. In the test mode of operation, the memory tester 9 applies data transfer commands to the memory device 10 in the form of address, data, and control signals on the respective buses, as well as the clock signal CLK and the test mode signal TM. To place the memory device 10 in the test mode of operation, the memory tester 9 drives the test mode signal TM active high turning OFF the transfer gate 44 and turning ON the transfer gates 36 and 38 such that the frequency multiplier circuit 32 drives the control circuit 16 with the test clock signal TSTCLK. In response to the test clock signals TSTCLK, the control circuit 16 controls the arrays 22–28 and the error detection circuit 18 to test for defective memory cells in the arrays 22–28, as will now be described in more detail. Although the test mode signal TM is shown as being applied on a single terminal of the memory device 10, one skilled in the art will realize that the test mode signal TM may take a variety of forms. For example, the test mode signal TM may correspond to a separate logic level signal, a "super voltage" applied to one of the pins of the memory device 10, or a combination of control signals on the control bus such as providing a column address strobe signal $\overline{CAS}$ before a row address strobe signal $\overline{RAS}$ to place the memory device 10 in the test mode of operation.

Before the control circuit 16 begins testing memory cells in the arrays 22–28, a test data pattern must be written to all the memory cells in the arrays 22–28. Such a test data pattern may be written to the arrays 22–28 in a number of different ways. First, the memory tester 9 may apply WRITE commands to the memory device 10 to write the desired test data pattern into the memory cells in the arrays 22–28. The memory tester 9 may write such test data to the arrays 22–28 either before or after the memory tester 9 places the memory device 10 in the test mode of operation. Alternatively, after being placed in the test mode the control circuit 16 may generate the test data written to the arrays 22–24. The test data pattern written to the memory cells in the arrays 22–28 may vary with some memory cells storing binary 0s and others storing binary 1s.

After the desired test data has been written to the arrays 22–28, the control circuit 16 drives the signals TEST and $\overline{\text{ENABLE}}$ active high and low, respectively, activating the error detection circuit 18. The control circuit 16 then pulses the clear signal CLEAR active high to ensure the error signal ERROR output by the error detection circuit 18 is initially inactive low. The control circuit 16 thereafter activates a row of memory cells in each of the arrays 22–28 and accesses an individual memory cell in each of the activated rows. The data stored in the accessed memory cells in the arrays 22–28 corresponds to the data signals D1–D4, respectively. The data signals D1–D4 are applied to the inputs of the error detection circuit 18, which operates as previously described to determine whether the data stored in all the accessed memory cells is equal. When the data stored in the accessed memory cells is equal, the error detection circuit 18 maintains the error signal ERROR inactive low, and when the data is unequal the error detection circuit 18 drives the error signal ERROR active high. The memory tester 9 monitors the error signal ERROR on the terminal 46 to determine whether any of the accessed memory cells is defective. Notice that since the control circuit 16 is operating at a higher frequency determined by the test clock signal TSTCLK, the memory tester 9 cannot typically detect the state of the error signal ERROR after the error detection circuit 18 compares the data stored in each group of four memory cells in the arrays 22–28. Instead, the memory tester 9 typically detects the error signal ERROR after a predetermined number of comparisons have been made by the error detection circuit 18. For example, the control circuit 16 may apply the data stored in every memory cell in the activated rows in the arrays 22–28 to the error detection circuit 18 and thereafter detect the state of the error signal ERROR. If the error signal ERROR is active, the memory tester 9 knows that at least one of the memory cells in one of the activated rows in the arrays 22–28 is defective. After the memory tester 9 has detected the state of the error signal ERROR, the control circuit 16 pulses the clear signal CLEAR active high to ensure the error signal ERROR in reset inactive low. The control circuit 16 then controls the arrays 22–28 and error detection circuit 18 as previously described to activate rows of memory cells in the arrays 22–28 and test the memory cells in each of the activated rows. The memory cells in the arrays 22–28 are accessed such that the accessed memory cells each store the same binary data if not defective. Thus, the test data pattern written to the memory cells and the sequence of activating the cells ensure the cells being accessed store the same binary data if operating properly. One skilled in the art will realize, however, other embodiments of the error detection circuit 18 could allow cells storing different data to be accessed and that data applied to the circuit 18. For example, in FIG. 3 the data signals D1, $\overline{\text{D1}}$ could be coupled through inverters to their associated NAND gates. In such an embodiment, the data compression circuit 100 indicates no error when the signals D1 and D2 have different binary values and detects an error when such values are equal.

The test circuit 12 enables the external memory tester 9 operating at a rate determined by a lower frequency clock signal CLK to test the memory device 10 much more quickly than in a conventional test system. In a conventional test system, the external memory tester 9 drives the memory device 10 with the clock signal CLK and transfers data to and from the memory device 10 at a slower rate corresponding to the lower frequency of the clock signal CLK. With the test circuit 12, however, once the external test circuit 48 has transferred the desired test data pattern into the memory cells in the arrays 22–28, the test circuit 12 accesses the memory cells in the arrays 22–28 at a much faster rate determined by the higher frequency of the test clock signal TSTCLK. The faster rate at which the memory cells in the arrays 22–28 are accessed results in a corresponding decrease in the test time of the memory device 10 including the test circuit 12. In addition, additional time savings in testing the memory device 10 is realized by the data compression performed by the error detection circuit 18. The tests circuit 12 enables the data stored in four memory cells to be simultaneously accessed and compared to determine whether any of the accessed memory cells is defective. Thus, the test circuit 12 reduces the time it takes to read the test data stored in the arrays 22–28 to detect a defective memory cell. In a conventional test system, each memory cell in each of the arrays 22–28 must be accessed individually and the data stored in that cell read by the memory tester 9 to determine whether the data stored in the memory cell equals the data initially written to that memory cell. With the test circuit 12, however, the time it takes to read the data stored in all of the memory cells in the arrays 22–28 is reduced because the error detection circuit 18 simultaneously compares the data in four accessed memory cells.

In the embodiment of FIG. 1, the test circuit 12 accesses a single memory cell in each of the arrays 22–28 and applies the data stored in each accessed memory cell to a respective input of the error detection circuit 18. One skilled in the art will realize the structure of the error detection circuit 18 and interconnection between the circuit 18 and arrays 22–28 may vary. The number of memory-cell arrays may vary and the number of inputs to the error detection circuit 18 may vary accordingly. For example, the memory device 10 may include thirty-two memory-cell arrays each coupled to one input of the error detection circuit 18. One skilled in the art will realize more data signals may be compared by the error detection circuit 18 simply by cascading more data compression circuits 100–104 in a circuit analogous to that shown in FIG. 2. Alternatively, a number of memory cells in a single array may be simultaneously accessed and the data applied to the error detection circuit 18. Furthermore, different data can be written to the arrays 22–28 as long as the logic functions implemented by the data compression circuits 100, 102 are designed to decode the pattern of data written to the arrays 22–28. In addition, the test circuit 12 may be utilized in a variety of the memory devices 10 including SDRAMs, asynchronous DRAMs, static RAMs, and packetized SDRAMs such as Synclink DRAMs ("SLDRAMs").

Figure 4:
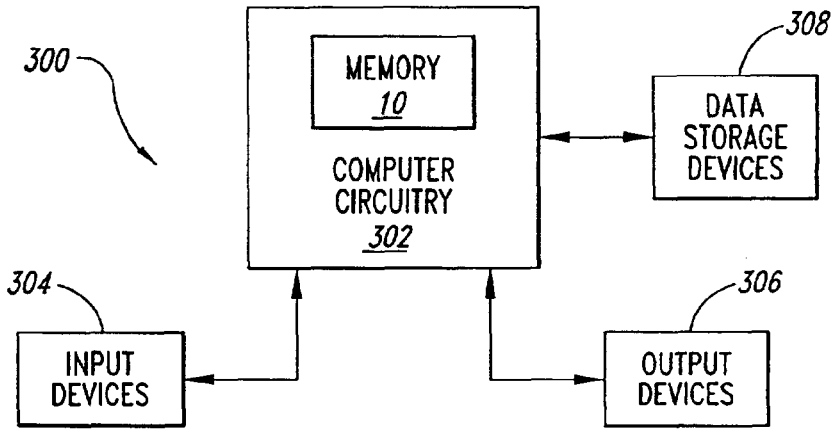
FIG. 4 is a functional block diagram of a computer system including the memory device of FIG. 1.

FIG. 4 is a block diagram of a computer system 300 including the memory device 10 of FIG. 1. The computer system 300 includes computer circuitry 302 for performing various computing functions, such as executing specific software to perform specific calculations or tasks. In addition, the computer system 300 includes one or more input devices 304, such as a keyboard or a mouse, coupled to the computer circuitry 302 to allow an operator to interface with the computer system 300. Typically, the computer system 300 includes one or more output devices 306 coupled to the computer circuitry 302, such output devices typically being a printer or a video terminal. One or more data storage devices 308 are also typically coupled to the computer circuitry 302 to store data or retrieve data from the external storage media (not shown). Examples of typical data storage devices 308 include hard and floppy disks, tape cassettes, and compact disk read only memories ("CD-ROMs"). The computer circuitry 302 is typically coupled to the memory device 10 through a control bus, a data bus, and an address bus to provide for winding data to and reading data from the memory device 10 as previously explained.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

We claim:

1. A test circuit for detecting defective memory cells in a plurality of memory cells in a memory device, the test circuit comprising:

a test mode terminal adapted to receive a test mode signal;

an error detection circuit including a plurality of inputs and an output, each input coupled to some of the plurality of memory cells, the error detection circuit developing an active error signal on an output when the binary value of data on at least one input is different from predetermined binary values of data, the error detection circuit comprising:

a first data compression circuit including first and second pairs of complementary inputs adapted to receive first and second complementary data signals, respectively, and having a pair of outputs;

a second data compression circuit including first and second pairs of complementary inputs adapted to receive third and fourth complementary data signals, respectively, and having a pair of outputs;

a third data compression circuit including a first pair of complementary inputs coupled respectively to the outputs of the first data compression circuit, and a second pair of complementary inputs coupled respectively to the outputs of the second data compression circuit and having a pair of outputs;

a logic gate having an output and having inputs coupled respectively to the outputs of the third data compression circuit, and a latch having a set input coupled to the output of the logic gate and an output coupled to a data terminal of the memory device; and a control circuit coupled to the test mode terminal, the error detection circuit, and the memory-cells, the control circuit operable responsive to the test mode signal being active to apply the data of accessed memory cells to the associated inputs of the error detection circuit such that the error detection circuit drives the error signal active when the binary value of the data stored in at least one accessed memory cell is different from predetermined binary values.

2. The test circuit of claim 1 wherein the memory cells are located in a plurality of arrays, each array coupled to an input of the error detection circuit and the control circuit simultaneously accessing at least one memory cell in each of the plurality of arrays.

3. The test circuit of claim 1 wherein the error detection circuit comprises the data signals applied on its inputs and develops the error signal in response to the compressed data.

4. The test circuit of claim 1 wherein the plurality of memory cells are located in a plurality of arrays.

5. A test circuit for detecting defective memory cells in a plurality of memory-cell arrays in a memory device, the test circuit comprising:

a test mode terminal adapted to receive a test mode signal;

an external clock terminal adapted to receive an external clock signal having a frequency;

a clock multiplier circuit having an input coupled to the external clock terminal, the multiplier circuit developing an internal clock signal on an output in response to the external clock signal, the internal clock signal having a frequency greater than the frequency of the external clock signal;

an error detection circuit including an output coupled to a terminal of the memory device, a clear terminal adapted to receive a clear signal, an enable signal adapted to receive an enable signal, and further including a plurality of inputs, each input coupled to one of the plurality of memory-cell arrays, the error detection circuit operable, when the enable signal is active, to develop an active error signal on an output when the binary value of data on at least one input is different from predetermined binary values of data, and to drive the error signal inactive responsive to the clear signal, the error detection circuit comprising:

a first data compression circuit including first and second pairs of complementary inputs adapted to receive first and second complementary data signals, respectively and having a pair of outputs;

a second data compression circuit including first and second pairs of complementary inputs adapted to receive third and fourth complementary data signals, respectively and having a pair of outputs;

a third data compression circuit including a first pair of complementary inputs coupled respectively to the outputs of the first data compression circuit, and a second pair of complementary inputs coupled respectively to the outputs of the second data compression circuit, and having a pair of outputs;

a logic gate having an output and having inputs coupled respectively to the outputs of the third data compression circuit; and a latch having an input coupled to the output of the logic gate and an output coupled to a data terminal of the memory device; and a control circuit coupled to the test mode terminal, the output of the clock multiplier circuit, and the memory-cell arrays, the control circuit operable, when the test mode signal is active, responsive to the internal clock signal to apply the data of accessed memory cells in the arrays to the associated inputs of the error detection circuit such that the error detection circuit drives the error signal active when the binary value of the data stored in at least one accessed memory cell is different from predetermined binary values, the control circuit applying the data of accessed memory cells to the error detection circuit until all memory cells in the arrays have been accessed, and activating the clear signal after the data of a predetermined number of memory cells has bean applied to the error detection circuit.

6. The test circuit of claim 5 wherein the control circuit simultaneously accesses at least one memory cell in each of the plurality of arrays and applies the data stored in the accessed memory cells it associated inputs of the error detection circuit.

7. The test circuit of claim 5 wherein the error detection circuit compresses the data applied on its inputs and develops the error signal in response to the compressed data.

8. A memory device, comprising:

an address bus;

a control bus;

a data bus;

a test mode terminal adapted to receive a test mode signal;

an address decoder coupled to the address bus;

a control circuit coupled to the control bus;

a read/write circuit coupled to the data bus;

an array coupled to the address decoder and read/write circuit, the array including a plurality of memory cells; and a test circuit coupled to the data bus, comprising:

an error detection circuit including a plurality of inputs and an output, each input coupled to some of the plurality of memory cells, the error detection circuit developing an active error signal on an output when the binary value of data on at least one input is different from predetermined binary values of data, the error detection circuit comprising:

a first data compression circuit including first and second pairs of complementary inputs adapted to receive first and second complementary data signals, respectively, and having a pair of outputs;

a second data compression circuit including first and second pairs of complementary inputs adapted to receive third and fourth complementary data signals, respectively and having a pair of outputs;

a third data compression circuit including a first pair of complementary inputs coupled respectively to the outputs of the first data compression circuit, and a second pair of complementary inputs coupled respectively to the outputs of the second data compression circuit, and having a pair of outputs;

a logic gate having an output and having inputs coupled respectively to the outputs of the third data compression circuit; and a latch having a set input coupled to the output of the logic gate and an output coupled to a data terminal of the memory device; and a control circuit coupled to the test mode terminal, the error detection circuit, and the array, the control circuit operable responsive to the test mode signal being active to apply the data of accessed memory cells to the associated inputs of the error detection circuit such that the error detection circuit drives the error signal active when the binary value of the data stored in at least one accessed memory cell is different from predetermined binary values.

9. The memory device of claim 8 wherein each memory cell comprises:

an access transistor having a gate terminal coupled to a respective word line associated with each row of memory cells in the array, and a drain terminal coupled to one of a respective pair of complementary digit lines associated with each column of memory cells and a source terminal; and a capacitor having a first plate coupled to the source terminal, and a second plate coupled to receive a reference voltage.

10. The memory device of claim 8, further including a plurality of arrays.

11. A test system for detecting defects in a memory device having address, data and control buses a memory cell array having a plurality of memory cells arranged in rows and columns, and a test mode terminal adapted to receive a test mode signal, the test system comprising:

an error detection circuit including a plurality of inputs and an output, each input coupled to some of the plurality of memory cells, the error detection circuit developing an active error signal on an output when the binary value of data on at least one input is different from predetermined binary values of data, the error detection circuit comprising:

a first data compression circuit including first and second pairs of complementary inputs adapted to receive first and second complementary data signals, respectively, and having a pair of outputs;

a second data compression circuit including first and second pairs of complementary inputs adapted to receive third and fourth complementary data signals, respectively, and having a pair of outputs;

a third data compression circuit including a first pair of complementary inputs coupled respectively to the outputs of the first data compression circuit, and a second pair of complementary inputs coupled respectively to the outputs of the second data compression circuit and having a pair of outputs;

a logic gate having an output and having inputs coupled respectively to the outputs of the third data compression circuit; and a latch having a set of input coupled to the output of the logic gate and an output coupled to a data terminal of the memory device;

a control circuit coupled to the test mode terminal, the error detection circuit, and the memory-cells, the control circuit operable responsive to the test mode signal being active to apply the data of accessed memory cells to the associated inputs of the error detection circuit such that the error detection circuit drives the error signal active when the binary value of the data stored in at least one accessed memory cell is different from predetermined binary value; and a memory tester coupled to the address, data, and control buses of the memory device and to the test method terminal, the memory tester activating the test mode signal to place the memory device into a test mode, storing a predetermined test pattern of data in the memory cells, and detecting a defect in the memory device when the error signal goes active.

12. The system of claim 11 wherein the memory tester sequentially applies separate predetermined test patterns of data that are stored in the memory cells, the memory tester determining at least once after applying a respective test pattern and before applying a subsequent test pattern whether the error signal is active.

13. A computer system, comprising:

a data input device;

a data output device; and computing circuitry coupled to the data input and output devices, the computing circuitry including a memory device having a data terminal adapted to receive a data signal and having a plurality of memory cells arranged in rows and columns, each memory cell storing a bit of data, and a test circuit having a test mode terminal adapted to receive a test mode signal, the test circuit comprising:

an error detection circuit including a plurality of inputs and an output, each input coupled to some of the plurality of memory cells, the error detection circuit developing an active error signal on an output when the binary value of data on at least one input is different from predetermined binary values of data, the error detection circuit comprising:

a first data compression circuit including first and second pairs of complementary inputs adapted to receive first and second complementary data signals, respectively, and having a pair of outputs;

a second data compression circuit including first and second pairs of complementary inputs adapted to receive third and fourth complementary data signals, respectively, and having a pair of outputs;

a third data compression circuit including a first pair of complementary inputs coupled respectively to the outputs of the first data compression circuit, and a second pair of complementary inputs coupled respectively to the outputs of the second data compression circuit, and having a pair of outputs;

a logic gate having an output and having inputs coupled respectively to the outputs of the third data compression circuit; and a latch having a set input coupled to the output of the logic gate and an output coupled to a data terminal of the memory device; and a control circuit coupled to the test mode terminal, the error detection circuit, and the memory cells, the control circuit operable responsive to the test mode signal being active to apply the data of accessed memory cells to the associated inputs of the error detection circuit such that the error detection circuit drives the error signal active when the binary value of the data stored in at least one accessed memory cell is different from predetermined binary values.

14. The computer system of claim 13 wherein the memory cells are located in a plurality of arrays.

*15. An error detection circuit for detecting defective memory cells in a plurality of memory cells in a memory device, the plurality of memory cells arranged in a plurality of memory-cell arrays, the error detection circuit adapted to receive a test mode signal and being coupled to each memory-cell array and to a terminal of the memory device, the error detection circuit operable when the test mode signal is active to simultaneously receive data from at least one memory cell in each of the plurality of memory-cell arrays and to apply an active error signal on the terminal when the data is different from expected values, the error detection circuit including a plurality of data compression circuits coupled to progressively compress the data received from the at least one memory cells and generate a data compression signal having a value indicative of the result of the data compression, and the error detection circuit generating the error signal responsive to the data compression signal.*

*16. The error detection circuit of claim 15 wherein the data compression signal comprises a complementary pair of signals and wherein the error detection circuit further includes a logic gate coupled to the receive the complementary signals and having an output, and further including a latch coupled to the output of the logic gate and an output coupled to the terminal of the memory device.*

*17. The error detection circuit of claim 15 wherein the memory cells are located in a plurality of arrays, each array coupled to the error detection circuit and the error detection circuit simultaneously receiving data from at least one memory cell in each of the plurality of arrays.*

*18. A memory device, comprising:*

*an address bus;*

*a control bus;*

*a data bus;*

*a test mode terminal adapted to receive a test mode signal;*

*an address decoder coupled to the address bus;*

*a control circuit coupled to the control bus;*

*a read/write circuit coupled to the data bus;*

*a plurality of memory-cell arrays coupled to the address decoder and read/write circuit, the arrays including a plurality of memory cells; and*

*an error detection circuit for detecting defective memory cells in each array, the error detection circuit adapted to receive the test mode signal and being coupled to each memory-cell array and to one of the address, control, and data busses, the error detection circuit operable when the test mode signal is active to simultaneously receive data from at least one memory cell in each of the plurality of memory-cell arrays and to apply an active error signal on one of the address, control, and data busses when the data is different from expected values, the error detection circuit including a plurality of data compression circuits coupled to progressively compress the data received from the at least one memory cells and generate a data compression signal having a value indicative of the result of the data compression, and the error detection circuit generating the error signal responsive to the data compression signal.*

*19. The memory device of claim 18 wherein the data compression signal comprises a complementary pair of signals and wherein the error detection circuit further includes a logic gate coupled to the receive the complementary signals and having an output, and further including a latch coupled to the output of the logic gate and an output coupled to the terminal of the memory device.*

*20. A test system for detecting defects in a memory device having address, data and control buses, a memory-cell array having a plurality of memory cells arranged in rows and columns, and a test mode terminal adapted to receive a test mode signal, the test system comprising:*

*an error detection circuit coupled to the test mode terminal and being coupled to the memory-cell array and to one of the address, control, and data busses, the error detection circuit operable when the test mode signal is active to receive from accessed memory cells and to apply an active error signal on one of the address, control, and data busses when the data is different from expected values, the error detection circuit including a plurality of data compression circuits coupled to progressively compress data from accessed memory cells.*

*21. The test system of claim 20 wherein the memory tester sequentially applies separate predetermined test patterns of data that are stored in the memory cells, the memory tester determining at least once after applying a respective test pattern and before applying a subsequent test pattern whether the error signal is active.*

*22. A computer system, comprising:*

*a data input device;*

*a data output device; and*

*computing circuitry coupled to the data input and output devices, the computing circuitry including a memory device including,*

*an address bus;*

*a control bus;*

*a data bus;*

*a test mode terminal adapted to receive a test mode signal;*

*an address decoder coupled to the address bus;*

*a control circuit coupled to the control bus;*

*a read/write circuit coupled to the data bus;*

*a plurality of memory-cell arrays coupled to the address decoder and read/write circuit, the arrays including a plurality of memory cells; and*

*an error detection circuit for detecting defective memory cells in each array, the error detection circuit adapted to receive the test mode signal and being coupled to each memory-cell array and to one*

*of the address, control, and data busses, the error detection circuit operable when the test mode signal is active to simultaneously receive data from at least one memory cell in each of the plurality of memory-cell arrays and to apply an active error signal on one of the address, control, and data busses when the data is different from expected values, the error detection circuit including a plurality of data compression circuits coupled to progressively compress the data from the at least one memory cells and generate a data compression signal having a value indicative of the result of the data compression, and the error detection circuit generating the error signal responsive to the data compression signal.*

*23. The computer system of claim 22 wherein the data compression signal comprises a complementary pair of signals and wherein the error detection circuit further includes a logic gate coupled to the receive the complementary signals and having an output, and further including a latch coupled to the output of the logic gate and an output coupled to the terminal of the memory device.*

*24. A method of detecting defective memory cells in a memory device including a plurality of memory-cell arrays, the method comprising:*

*placing the memory device in a test mode;*

*storing test data in the memory cells in the plurality of arrays;*

*accessing memory cells in at least some of the arrays;*

*progressively compressing the data stored in the accessed memory cells to generate a compression signal;*

*generating an error signal responsive to the data compression signal;*

*storing the error signal;*

*placing the error signal on a terminal of the memory device; and*

*detecting a defective memory cell responsive to the error signal being active.*

*25. The method of claim 24 wherein storing test data in the memory cells in the plurality of arrays includes transferring the same binary value of data to all memory cells in the arrays.*

*26. The method of claim 24 wherein placing the memory device in a test mode occurs after the step of storing test data.*

*27. A method of detecting defective memory cells in a memory device, comprising:*

*writing test data to the memory cells;*

*reading the test data from the memory cells;*

*compressing the data stored in the accessed memory cells a first time to generate a first set of data compression signals;*

*compressing the first set of data compression signals to generate an output data compression signal;*

*generating an error signal responsive to the output data compression signal; and*

*detecting a defective memory cell responsive to the error signal.*

*28. The method of claim 27 wherein writing test data to the memory cells comprises writing the same binary value to all the memory cells.*

*29. A method of detecting defective memory cells in a memory device, comprising:*

*writing test data to the memory cells;*

*reading the test data from the memory cells;*

*an error detection circuit for detecting defective memory cells in each array, the error detection circuit adapted to receive the test mode signal and being coupled to the memory-cell arrays and to one of the address, control, and data buses, the error detection circuit operable when the test mode signal is active to receive data from accessed memory cells and to apply an active error signal on one of the address, control, and data busses when the data is different from expected values, the error detection circuit including a plurality of data compression circuits coupled to progressively compress data form accessed memory cells and generate a data compression signal having a value indicative of the result of the data compression, and the error detection circuit generating the error signal responsive to the data compression signal.*

* * * * *